United States Patent
Jewula et al.

(10) Patent No.: US 11,303,263 B2
(45) Date of Patent: Apr. 12, 2022

(54) COMPONENT WITH IMPROVED HEAT DISSIPATION

(71) Applicant: SNAPTRACK, INC., San Diego, CA (US)

(72) Inventors: Tomasz Jewula, Markt Schwaben (DE); Veit Meister, Unterhaching (DE)

(73) Assignee: QUALCOMM Incorporated, San Diego, CA (US)

( * ) Notice: Subject to any disclaimer, the term of this patent is extended or adjusted under 35 U.S.C. 154(b) by 635 days.

(21) Appl. No.: 15/743,984

(22) PCT Filed: Jun. 15, 2016

(86) PCT No.: PCT/EP2016/063748
§ 371 (c)(1),
(2) Date: Jan. 11, 2018

(87) PCT Pub. No.: WO2017/008981
PCT Pub. Date: Jan. 19, 2017

(65) Prior Publication Data
US 2018/0219526 A1 Aug. 2, 2018

(30) Foreign Application Priority Data

Jul. 13, 2015 (DE) .................. 102015111307.4

(51) Int. Cl.
*H03H 9/02* (2006.01)
*H03H 9/10* (2006.01)
(Continued)

(52) U.S. Cl.
CPC ...... *H03H 9/02834* (2013.01); *H03H 9/1064* (2013.01); *H03H 9/1071* (2013.01);
(Continued)

(58) Field of Classification Search
CPC ............ H03H 9/02834; H03H 9/1064; H03H 9/1071; H03H 9/145; H03H 9/6489;
(Continued)

(56) References Cited

U.S. PATENT DOCUMENTS 7,940,146 B2 5/2011 Oda
2004/0130037 A1* 7/2004 Mishra ................ H01L 21/8252
257/778
(Continued)

FOREIGN PATENT DOCUMENTS

CN 1449030 A 10/2003
CN 103426835 A 12/2013
(Continued)

OTHER PUBLICATIONS

International Search Report and Written Opinion—PCT/EP2016/063748—ISA/EPO—dated Sep. 8, 2016.
(Continued)

*Primary Examiner* — Bryan P Gordon
(74) *Attorney, Agent, or Firm* — Patterson & Sheridan, L.L.P.

(57) ABSTRACT

In a component with component structures generating dissipation heat, it is proposed to apply on an active side of the substrate a heat-conducting means to the back side of the component substrate, which has a second thermal conductivity coefficient $\alpha_{LS}$, which is substantially higher than the first thermal conductivity coefficient $\alpha_S$ of the substrate. The heat dissipation then succeeds via the heat-conducting means and via connecting means which connect the substrate to a carrier.

9 Claims, 5 Drawing Sheets

Figure 1:
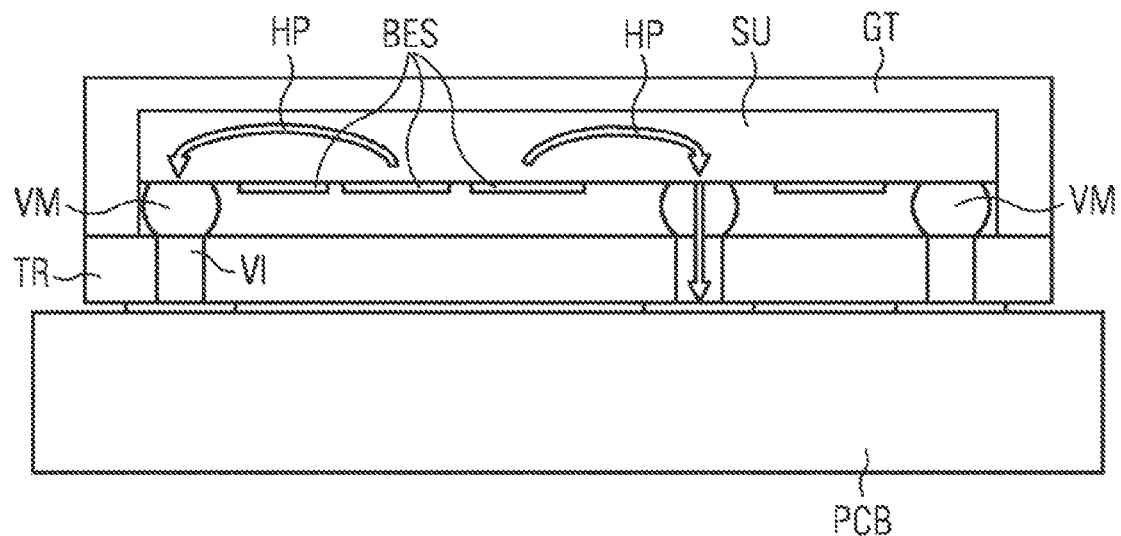

(51) Int. Cl.
*H05K 1/02* (2006.01)
*H05K 1/18* (2006.01)
*H03H 9/145* (2006.01)
*H03H 9/64* (2006.01)

(52) U.S. Cl.
CPC .......... *H05K 1/0203* (2013.01); *H05K 1/181* (2013.01); *H03H 9/145* (2013.01); *H03H 9/6489* (2013.01); *H05K 2201/1006* (2013.01); *H05K 2201/10083* (2013.01)

(58) Field of Classification Search
CPC ................ H05K 1/0203; H05K 1/181; H05K 2201/1006; H05K 2201/10083
USPC .................... 310/314, 315, 346, 348–353
See application file for complete search history.

(56) References Cited

U.S. PATENT DOCUMENTS

| | | |
|---|---|---|
| 2004/0237299 A1 | 12/2004 | Stelzl et al. |
| 2005/0167854 A1 | 8/2005 | Tikka et al. |
| 2008/0017223 A1 | 1/2008 | Sachdev et al. |
| 2009/0039379 A1* | 2/2009 | Shiraishi ............ H01L 23/49861 257/99 |
| 2009/0201102 A1* | 8/2009 | Oda .................... H03H 9/02834 333/193 |
| 2014/0015118 A1 | 1/2014 | Bae et al. |
| 2015/0054417 A1 | 2/2015 | Lee |
| 2016/0027717 A1* | 1/2016 | Jang ...................... H01L 27/092 361/718 |
| 2018/0277527 A1* | 9/2018 | Yota .................. H01L 21/30604 |
| 2018/0367116 A1* | 12/2018 | Goto .................... H03H 9/6489 |
| 2019/0280670 A1* | 9/2019 | Kuroyanagi .......... H03H 9/6483 |
| 2019/0288667 A1* | 9/2019 | Hayashi .............. H01L 41/1873 |
| 2019/0326191 A1* | 10/2019 | Kondo ................ H01L 23/3737 |

FOREIGN PATENT DOCUMENTS

| | | |
|---|---|---|
| EP | 1139412 A1 | 10/2001 |
| EP | 2555239 A2 | 2/2013 |
| JP | 2003347488 A | 12/2003 |
| JP | 2005217670 A | 8/2005 |
| JP | 2005223580 A | 8/2005 |
| JP | 2005325348 A | 11/2005 |
| JP | 2013066042 A | 4/2013 |
| JP | 2013131711 A | 7/2013 |
| WO | WO-2014029602 A1 | 2/2014 |

OTHER PUBLICATIONS

Nishizawa T., et al., "Realization of Small and Low Profile Duplexer using a CSSD Packaging Technology," Ultrasonics Symposium (IUS), 2009 IEEE International, IEEE, Piscataway, Sep. 20, 2009 NJ USA (Sep. 20, 2009), pp. 903-906, XP031654547, ISBN: 978-1-4244-4389-5.

Suzuki T., et al., "Analysis of Heat Dissipation Improvement using Bonded Wafer in Chip Size SAW Device Structure," 2013 IEEE International Ultrasonics Symposium (IUS), Jul. 1, 2013 (Jul. 1, 2013), pp. 1961-1964, XP055297468, DOI: 10.1109 / ULTSYM. 2013.0500 ISBN: 978-1-4673-5684-8.

* cited by examiner

COMPONENT WITH IMPROVED HEAT DISSIPATION

CROSS-REFERENCE TO RELATED APPLICATIONS

This application is a national stage application under 35 U.S.C. 371 of PCT/EP2016/063748, filed Jun. 15, 2016, which claims the benefit of German Patent Application Serial No. 102015111307.4, filed on Jul. 13, 2015, both of which are incorporated herein by reference in their entirety.

The self-heating that occurs in a microelectronic component under load can lead to mechanical stresses, to premature material fatigue or to an impermissible change in the component properties. It is therefore desirable in electronic components to reduce their self-heating and in particular to dissipate dissipation heat effectively to improve the properties of the electronic component under load. In a surface acoustic wave device (SAW device), the frequency stability, for example, and the ability of signal transmission can be increased.

The reduction of self-heating in microelectronic components produced on low thermal conductivity substrates, e.g. SAW components, is carried out by various measures. One of the common methods is to increase the surface area of active areas in the component, thereby reducing the energy density and thus also the heat generation.

Heat dissipation is often also enhanced by additional bumps, e.g. as known from T. Nishizawa, G. Endo, M. Tajima, S. Ono, O. Kawachi, "Realization of Small and Low Profile Duplexer Using A CSSD Packaging Technology", IEEE Ultrasonics Symposium, pp, 903-906, 2009.

In addition, there are also approaches to improving heat dissipation by supplementing a layer stack used in or on the component with thermally well-conductive layers on the active side of the component. Typically, dielectric layers (SiN, AlN, $Al_2O_3$) are used for this purpose. Metals can also be used for this purpose if they are separated from the electrically and/or acoustically active areas of the component by an insulating layer.

Thermally connecting such additional metal layers to the bumps in order to discharge the thermal energy more efficiently from the system is known from U.S. Pat. No. 7,940,146 B2.

Another measure for reducing self-heating known from an article by T. Suzuki, T. Nishizawa, O. Kawachi, "Analysis of Heat Dissipation Improvement Using Bonded Wafer in Chip Size SAW Device Structure", IEEE Joint UFFC, EFTF and PFM Symposium, pp. 1961-1964, 2013 is based on the use of multi-layered substrates. Here a relatively thin functional layer, e.g. made of a piezoelectric material, is adhesively bonded to a carrier material with higher thermal conductivity. Due to the reduced thickness of the thermally poorly conductive functional piezoelectric layer, the effective eddy current is increased in the component, thereby reducing the self-heating.

Object of the present invention is to provide a dissipation heat generating component in which the dissipation of the dissipation heat is improved and heating of the component by dissipation heat is reduced.

This object is achieved according to the invention by a component according to claim 1. Advantageous embodiments of the invention will become apparent from further claims.

While dissipation heat generated in known components of active components structures is dissipated substantially over the substrate, i.e., in the substrate plane outwards into the package or the carrier substrate, the component according to the invention uses a heat-conducting means applied to the back of the component, which has a much higher thermal conductivity coefficient than the substrate. The dissipation heat generated in the component structures can then be guided on the shortest path through the substrate plane to the heat-conducting means. There it is further dissipated parallel to the substrate plane and finally dissipated into the carrier via metallic connecting means by which the active side of the substrate is mounted on a carrier.

At least part of the heat flow is thereby passed through the substrate again. The path length of the heat flow guided through the substrate is significantly shortened compared with the described known solutions in that the substrate has structured areas where the layer thickness of the substrate is reduced. As a result, the vertical heat transport through the substrate in the structured areas of the substrate from the component structures to the heat-conducting means and/or from the heat-conducting means to the carrier is also reduced in comparison with an unstructured substrate. Because of the better thermal conductivity of the heat-conducting layer, heat dissipation is better and more effective than with no heat-conducting layer.

In particular, the heat can be dissipated from the substrate in the area above or below the component structures. The dissipation occurs outside the substrate and so excessive heating of the substrate is avoided. Thus, the reliability of the component can be increased, a thermal drift of the component properties can be reduced and the thermally induced aging processes of the component can be slowed down. As a result, the life of the component can be significantly extended.

According to one embodiment, the heat-conducting means is applied on the rear side at least in such a way that it thermally conductively connects areas above the component structures with areas above the metallic connecting means and on this path bridges in parallel the corresponding route within the substrate. In this way, a dissipation path for the heat from the component structures to the metallic connecting means is guaranteed. The part of the heat dissipation path that leads transversely through the substrate is minimized, and the path from the component structures to the metallic connecting means is preferably made by the shortest path, but on the back side of the substrate.

According to one embodiment, the metallic connecting means are connected to a heat sink, which is arranged in the carrier. The carrier itself may be a part of the component package, i.e., the package, and forms a unit together with the component. However, the package may include other components.

Typically, the carrier on the underside, i.e., facing away from the component surface, has metallic connection surfaces through which the carrier or the encapsulated component can be mounted in a circuit environment, such as a circuit board. Extended metallic areas can serve as heat sinks, which, due to their high heat capacity, even in the presence of large amounts of heat do not heat up as strongly as materials with lower heat capacity. In electrically highly conductive materials, including heat sinks, further heat dissipation is made much easier as compared with materials with lower thermal conductivity.

The carrier may include a layer of a ceramic material. The carrier may be multi-layered and include layers of different materials. A multilayer carrier may also include plastic insulating layers and structured metallizations arranged between them.

The structured areas are provided in the region of the component structures and/or in the region of the metallic connecting means. The structured areas facilitate heat transport in a targeted manner at the points where the heat is generated or where it is to be dissipated again via the metallic connecting means. The structured areas thus facilitate heat transport through the substrate in a targeted manner at the crucial and important locations.

One way to facilitate heat transport in the structured areas is to reduce the layer thickness of the substrate in the structured areas. For this purpose, recesses may be provided in the back side of the substrate. In the recesses, the thickness of the substrate can be reduced to a thickness necessary for the function of the component. Since the layer thickness is reduced only in areas limited in their surface area, it may be thinner in the recesses than allowed for mechanical reasons for the entire substrate. In this way the path through the material with the first and lower thermal conductivity coefficient is minimized.

In one embodiment, the substrate comprises a piezoelectric material and the component itself is a component working with acoustic waves, in particular a component working with surface acoustic waves. Here, the invention can be used particularly advantageously, since the piezoelectric materials commonly used have poor or low thermal conductivity coefficients $\alpha_S$. In addition, components operating with acoustic waves are particularly sensitive to heating and exhibit a temperature drift of the frequency expressed by the TCF (temperature coefficient of the center frequency).

A component operating with acoustic waves is, for example, a filter which has a filter input and component structures assigned to it, as well as a filter output and further component structures assigned thereto. If a coupling takes place between the component structures assigned to the input and to the output or their leads or connection surfaces, then electrical signals applied to the input can be coupled directly into the output, and into the structures connected to the output, where they cause interference signals.

Under certain circumstances, an electrically conductive layer, such as the heat-conducting layer, located on the back side of the substrate, could then lead to crosstalk by causing a capacitive coupling between input and output structures.

According to one embodiment, such a crosstalk is avoided by structuring the electrically conductive layer applied as a heat-conducting means into two or more galvanically separated areas, wherein one area is arranged above the component structures of the input side and one area is arranged above the component structures of the output side. In this way, no additional capacitive coupling is generated by the electrically conductive layer of the heat-conducting means.

In principle, the heat-conducting means can also comprise a layer applied over the entire surface area on the back side of the substrate, which may be metallic if no crosstalk is to be feared. Preferably, however, the layer over the entire surface is made of an electrically insulated material or a semiconductor for the reasons stated.

In a further embodiment, the layer applied as a heat conducting means on the back side of the substrate is extended towards the carrier and down to at least one side surface of the substrate and there connected to a heat sink, which is arranged on or in the carrier. In this way, the heat flow from the layer of the heat-conducting means through the substrate to the connecting means can be reduced by heat-conducting bridging and heat dissipation can be faster and better.

The metallic connecting means may be formed as bumps or solder pads and connect contact surfaces on the substrate with corresponding connection points on the upper side of the carrier. In both cases, the connecting means are metallic and therefore have a high thermal conductivity coefficient alpha.

In a further variant, it is possible to provide, in addition to the carrier required for electrical connection of the component structures or of the component, itself, further connecting means which serve solely for heat dissipation. This can be advantageous in particular if particularly large amounts of heat are generated in the component or in the substrate and if sufficient substrate surface is still available for this additional carrier serving only for heat dissipation. The further connecting means can be electrically connected to component structures. Preferably, they are electrically isolated from the component structures.

The heating means may comprise a material selected from aluminum, silver, copper, gold or electrically insulated materials such as aluminum nitride and silicon carbide.

The invention will be explained in greater detail below with reference to exemplary embodiments and the associated figures. The figures shown are only schematic and not true to scale. The figures therefore represent neither absolute nor relative dimensions, since individual parts may be shown enlarged for better clarity.

Figure 2:
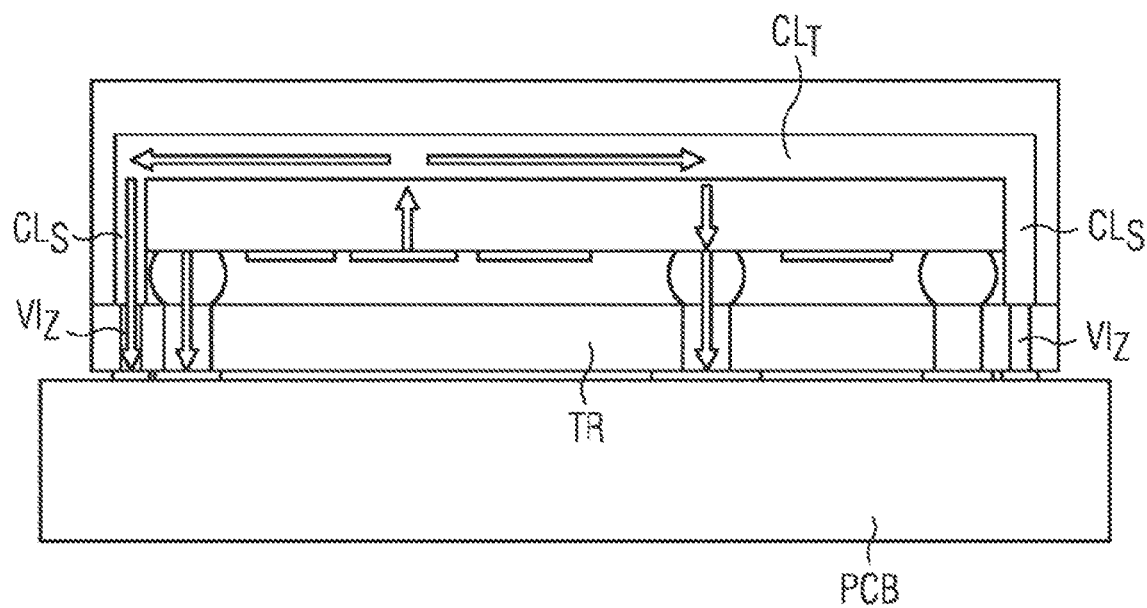
Figure 3:
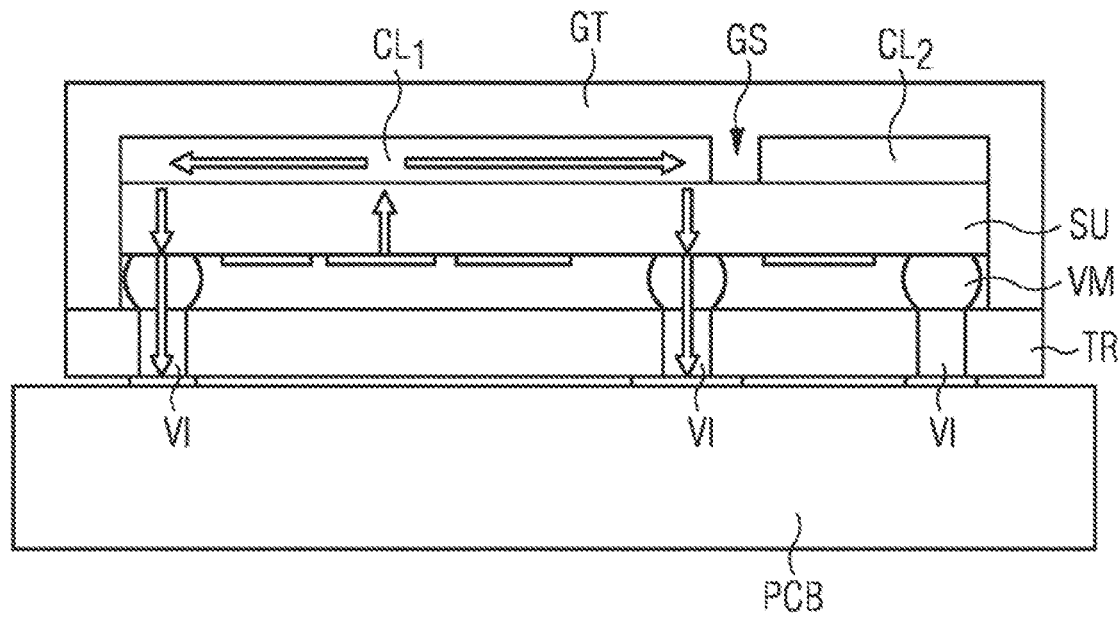
Figure 4:
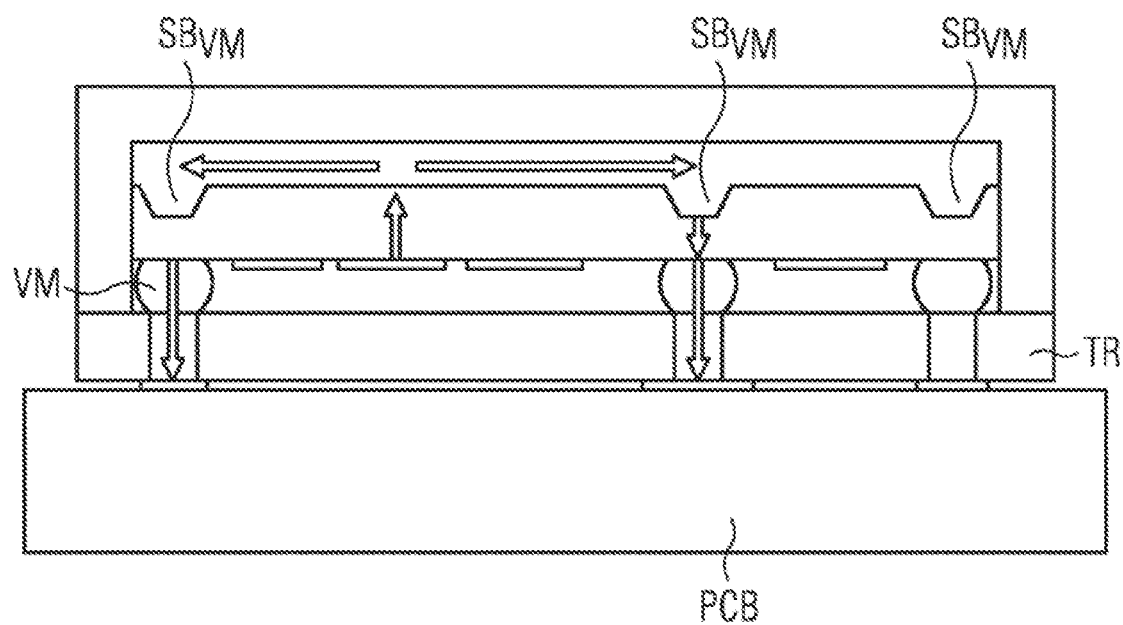
Figure 5:
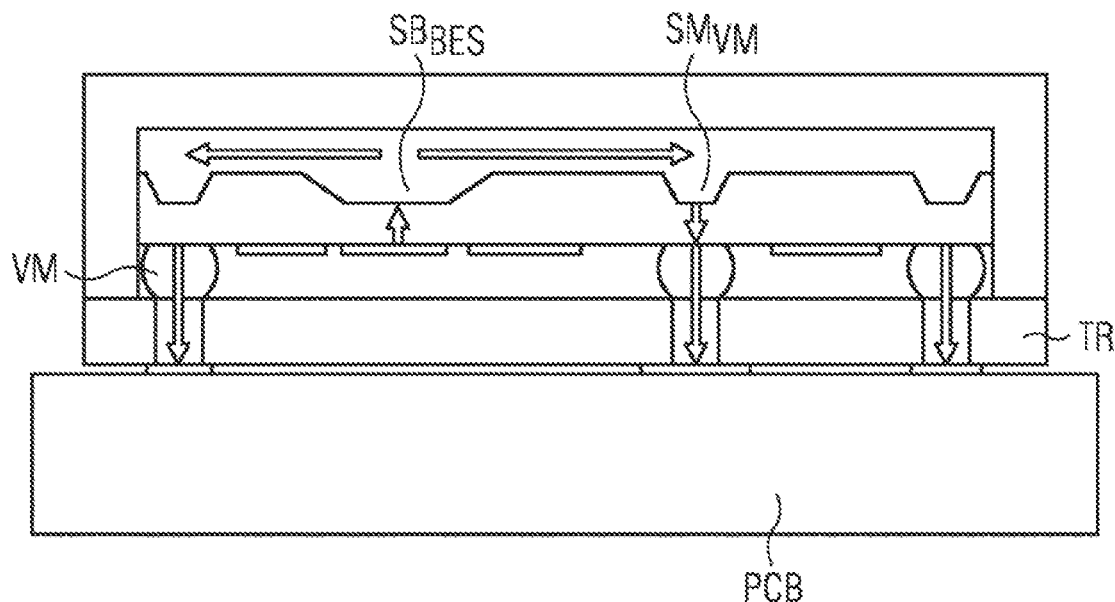
Figure 6:
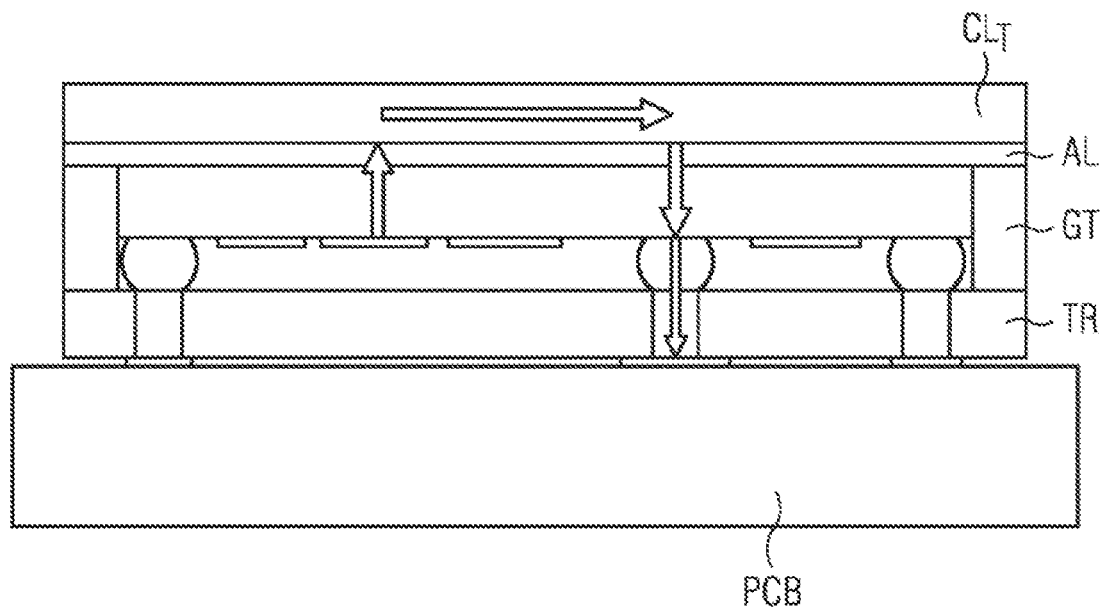
Figure 7:
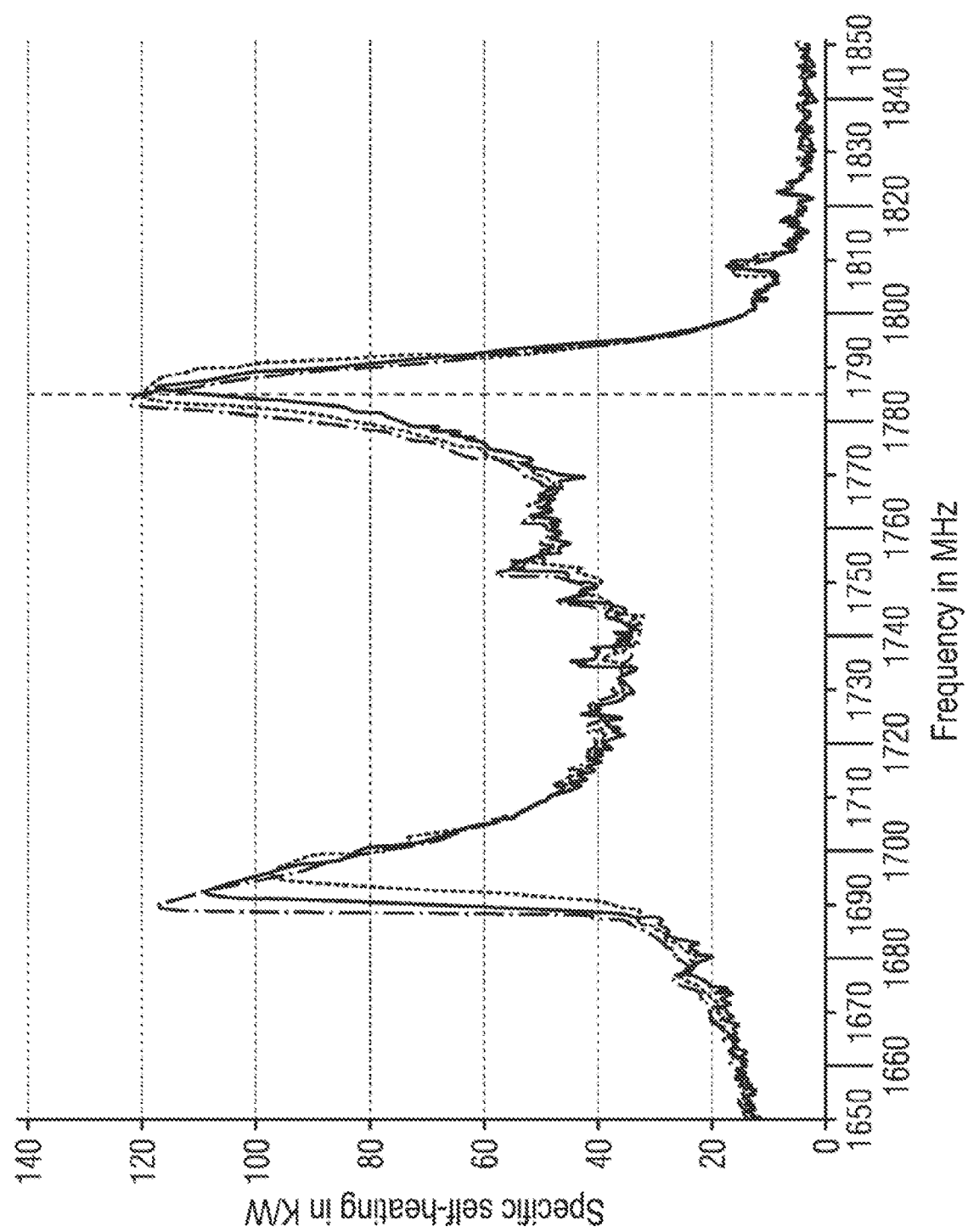
Figure 8:
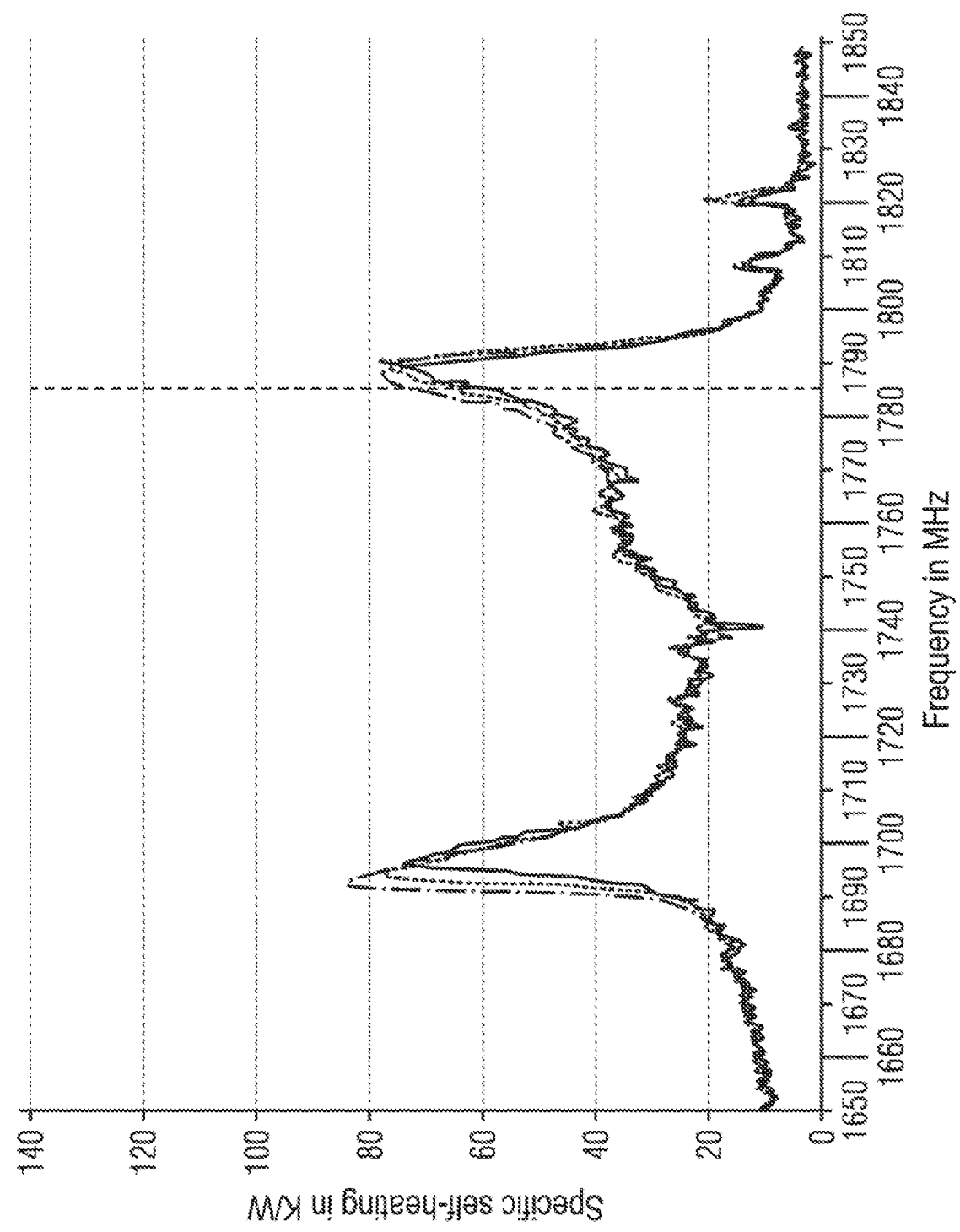

FIG. 1 shows, in cross-section, a per se known component working with surface acoustic waves, together with the paths along which the generated dissipation heat is discharged, FIG. 2 shows a simple embodiment of the invention with reference to a schematic cross-section through the component, FIG. 3 shows a further embodiment of the invention with reference to a cross-section, FIG. 4 shows an embodiment with first structured areas on the basis of a schematic cross-section, FIG. 5 shows an embodiment with first and further structured areas in schematic cross-section, FIG. 6 shows a fifth embodiment in schematic cross-section, FIG. 7 shows the temperature of a measuring point of a known component as a function of the frequency of the applied electrical signal, FIG. 8 shows the temperature of a measuring point of a component according to the invention as a function of the frequency of the applied electrical signal.

FIG. 1 snows a per se known component which operates with surface acoustic waves, i.e., a SAW component (SAW=Surface Acoustic Wave). This comprises a piezoelectric substrate SU which is bonded in flip-chip design via bumps serving as connecting means VM to a carrier TR comprising, for example, a ceramic plate. On the active side of the substrate SU, which faces the carrier TR, schematic component structures BES in the form of metallizations are indicated. Not shown are electrical connections that connect the component structures BES with contact surfaces on the active side of the substrate SU. The contact surfaces are used for electrical and mechanical coupling by means of connecting means VM here illustrated as bumps. The device may also be protected by a protective layer GT, for example, with a globe top coating comprising an epoxy resin. A cavity between the active side of the substrate SU and the carrier TR, within which the component structures BES are arranged, can be hermetically sealed with this coating.

As can be seen from the figure, the component is electrically and mechanically connected, for example soldered, to a printed circuit board PCB via electrical connections on the underside of the carrier TR.

Curved arrows within the substrate SU indicate the heat flow with which the dissipation heat generated by the component structures BES extends over the substrate within the layer plane of the substrate SU and is ultimately dissipated via the connecting means VM to the carrier TR and further to the printed circuit board PCB. Due to the poor thermal conductivity coefficient $\alpha_S$ of the piezoelectric substrate SU, a strong heating of the substrate may occur. Heat dissipation is delayed and the component may overheat.

FIG. 2 shows a first embodiment with reference to a schematic cross-section through a component according to the invention. Here too, a piezoelectric substrate SU is again mounted via connecting means VM (bumps) on a carrier TR, which in turn is applied to a printed circuit board PCB. However, the rear side of the substrate SU is coated with a layer of a heat-conducting means $CL_T$, for example, with a metallic layer. In this case, this layer of the heat-conducting means also extends over a section $CL_S$ which extends over the side surfaces of the substrate SU down towards the carrier TR. In the carrier, in turn, the layer of the conductive material CL or its lateral section $CL_S$ is connected to an additional through-connection $VI_Z$ or a via VI, which likewise has good heat conductivity due to its metallic cladding or filling and allows good heat transport through the carrier TR. The additional through-connection $VI_Z$ may be reserved for heat transfer alone. However, it is also possible to connect the additional through-connection $VI_Z$ to ground potential.

Again, the heat flow is shown schematically by arrows. It can be seen that heat flow now predominantly takes place from the component structures transversely through the substrate SU into the layer of the heat-conductive material $CL_T$. Within this layer, a rapid heat transfer takes place, so that during operation of the component under load a rapid heat distribution and thus a uniform heating of the heat-conducting means CL takes place. The heating of the substrate is correspondingly more uniform.

From the layer of the heat-conducting means $CL_T$ on the back side of the substrate SU, the heat is dissipated on two routes towards the carrier TR and onwards to the printed circuit board PCB on two fundamentally different paths. A first path extends from the heat-conducting means transversely through the substrate to a connecting means and via the connecting means to a through-connection through the carrier TR towards the circuit board PCB. The further heat dissipation path already described takes place through the lateral sections $CL_S$ of the heat-conducting means towards corresponding through-connections in the carrier.

The illustrated component shows an efficient heat dissipation and a reduced temperature increase under load. Hence it is improved in frequency accuracy, aging resistance and reliability over the known component shown in FIG. 1.

FIG. 3 shows a second embodiment of the invention, in which the layer applied to the back side of the substrate of the heat-conducting means CL is divided into two areas $CL_1$ and $CL_2$. The two areas are galvanically separated from one another by a galvanic separation GS, so that a capacitive coupling of different component structures via a continuous, electrically conductive layer to heat-conducting means is avoided. Although not shown, the layer of heat-conducting means $CL_1$, $CL_2$ can be continued here via corresponding side sections across the side surfaces of the substrate SU towards the carrier, in order to allow additional heat dissipation in this way.

FIG. 4 shows a third embodiment of the invention. In contrast to FIG. 3, here the heat-conducting means is applied to the back side of the substrate SU as a layer across the entire surface area. In order to shorten the heat path through the substrate, which has a poor first thermal conductivity coefficient $\alpha_S$, the layer thickness of the substrate SU is reduced in structured areas $SB_{VM}$. In this embodiment, these structured areas $SB_{VM}$ are arranged exclusively above the connecting means VM and not above acoustically active component structures BES, so that their function is not disturbed by the reduced layer thickness in the structured areas $SB_{VM}$.

The heat path therefore now extends from the point of heat generation at the component structures BES transversely through the substrate SU into the heat-conducting layer $CL_T$, there laterally up to the structured areas SB and there through the reduced layer thickness of the substrate SU to the connecting means VM and through these into the carrier TR. Since the section through the substrate, i.e., the section of the heat path through the material with the lowest thermal conductivity coefficient $\alpha_S$, is shortened compared to the previous exemplary embodiments, an improved heat dissipation takes place via the structured areas and the connecting means VM arranged underneath.

In one embodiment, e.g., the substrate material is $LiNbO_3$, which has a thermal conductivity coefficient $\alpha_S$ of 4.6 W/mK. The thermal conductivity coefficient of an existing epoxy cover GT is actually only 0.5 W/mK. The thermal conductivity coefficient $\alpha_{LS}$ of a layer of the heat-conducting means CL made, for example, of aluminum, is on the other hand 237 W/mK—about 50 times as high.

FIG. 5 shows, in a schematic cross-section, a component according to a fourth embodiment, in which both first structured areas $SB_{VM}$ are placed above the connecting means VM and second structured areas $SB_{BES}$ above the component structures BES on the back side of the substrate. These two structured areas may differ in terms of the depth of the recess and the reduced layer thickness of the substrate. Furthermore, the recess may be larger above the component structures BES to allow a reduced layer thickness over the entire area of the component structures. The layer thickness of the substrate may be greater above the component structures BES than above the connecting means VM.

Since here the path from the component structures into the heat-conducting means and the path from the heat-conducting means through the substrate into the connecting means VM is now shortened, the heat dissipation of the component according to the fourth embodiment is further improved compared to the third embodiment shown in FIG. 4. By the structuring in a relatively small area of the substrate, the stability of the substrate is not inadmissibly reduced by the recesses. A risk of fracture is ruled out, especially as the electrically conductive layer or the layer of the heat-conducting means is positively applied to the back side of the substrate and thus increases its structural strength. Although not shown, the layer of the heat-conducting means CL may also extend across the side surfaces of the substrate toward the carrier to allow for direct heat dissipation, which need not occur exclusively through the substrate.

In the second to fourth embodiments, the layer of the heat-conducting means CL is preferably positively applied to the back side of the substrate SU. This can be achieved by suitable metallization, for example a base metallization generated via the gas phase and a galvanic or currentless reinforcement thereof.

However, it is also possible, as illustrated in a fifth embodiment with reference to FIG. 6, to adhesively bond the heat-conducting means $CL_T$ as a compact layer onto the back side of the substrate SU. The adhesive used here is preferably an adhesive filled with thermally highly conductive particles, which thus has a good overall heat conductivity.

Through the adhesion of the heat-conducting means in the form of a metal sheet or a foil, the step of metal deposition or the deposition of an insulating heat-conducting means from the gas phase can be dispensed with. At the same time, the layer of heat-conducting means applied with adhesive can form part of the seal or of the protective layer or of the package of the component. Shown in the figure are edge regions of a protective layer GT, which laterally delimit the substrate and hermetically seal the cavity between the carrier and the substrate. The heat-conducting means $CL_T$ then sits flush on these side parts and is tightly connected to the substrate with the aid of the adhesive or the adhesive layer AL. This embodiment too may be combined with the first, second, third or fourth embodiment, without departing from the idea of the fifth embodiment.

The layer of the heat-conducting means, which is an additional advantage over known components, can be generated or applied in one step, which can be easily integrated into the manufacturing process of the component. The risk of inadmissible self-heating of components can therefore be reduced in a cost-effective manner by the invention and leads in a cost-effective manner to components with improved thermal stability, lower drift of the properties by reduced self-heating and to an extended life and increased reliability.

FIG. 7 shows the measured temperature increase of a measuring point on the substrate of a known component in K/W as a function of the frequency of an electrical signal applied to the component structures. In the figure, three curves at different power levels are superimposed.

The component here is a duplexer for Band 3. It turns out that at resonant frequencies of the duplexer a particularly great amount of dissipated heat is generated, which can raise the temperature by up to about 120° C. At a temperature coefficient of the center frequency of the substrate material used of 27.1 ppm/K, this corresponds to a frequency shift of about 2700 ppm, corresponding to an absolute frequency shift of about 5.8 MHz. The highest increase in temperature due to dissipation heat and heating up is measured at a frequency of 1785 MHz, which corresponds to the righthand passband edge.

FIG. 8 shows the measured temperature increase of a measuring point on the substrate of a component according to the invention in K/W as a function of the frequency of an electrical signal applied to the component structures. In the figure, three curves at different power levels are superimposed.

Here again, the component is the duplexer for Band 3, which, however, as shown in FIG. 6, is illustrated with an aluminum foil applied by an adhesive. The highest heating or temperature increase is again in the range of the righthand passband edge, but is much lower under otherwise identical measurement conditions and reaches only about 75° C. With the same temperature coefficient, this results in a temperature-induced frequency drift of about 3.6 MHz, i.e., a reduction of 38%.

Although the invention is described only for components working with acoustic waves, the invention is suitable for all electrical and microelectronic components, which are applied to a carrier in a flip-chip arrangement and have a substrate with poor heat conductivity, i.e., with a low thermal conductivity coefficient. The invention is not therefore limited to the embodiments.

The invention is applicable to various types of components, can be adapted to different housing technologies, may be geometrically shaped differently than shown and can be combined with different materials with respect to the carrier, substrate or printed circuit board. In addition, a component according to the invention may comprise further covering layers, which may be arranged above or below the covering layers described.

LIST OF REFERENCE SIGNS

AL adhesive layer
BES component structures on active side
$CL_S$ heat-conducting means laterally to substrate
$CL_T$, $CL_1$, $CL_2$ heat-conducting means on the back side
GS galvanic isolation
GT cover/protective layer
PCB circuit board
$SB_{BES}$ structured areas of the substrate via component structures
$SB_{VM}$ structured areas of the substrate via connecting means
SU substrate
TR carrier
VI via or through-connection
$VI_Z$ additional via or through-connection
VM metallic connecting means for heat dissipation
$\alpha_{LS}$ second thermal conductivity coefficient (heat conducting means)
$\alpha_S$ first thermal conductivity coefficient (substrate)

The invention claimed is:

1. A component, comprising:
   a substrate having a first thermal conductivity coefficient $\alpha_S$;
   component structures on an active side of the substrate, the component structures configured to generate dissipation heat;
   a carrier;
   metallic connecting means, with which the active side of the substrate is mounted on the carrier; and
   heat-conducting means applied to a back side of the substrate located opposite to the active side, wherein the heat-conducting means comprises a material having a second thermal conductivity coefficient $\alpha_{LS}$, and $\alpha_{LS} \gg \alpha_S$;
   wherein vertical heat transport through the substrate in structured areas of the substrate from the component structures to the heat-conducting means and/or the heat-conducting means to the metallic connecting means is facilitated,
   wherein a layer thickness of the substrate is reduced in the structured areas.

2. The component according to claim 1,
   wherein the heat-conducting means on the back side connects at least one or a plurality of areas above the component structures to the areas above the metallic connecting means.

3. The component of claim 1, wherein the metallic connecting means are connected to a heat sink in the carrier.

4. The component of claim 1, wherein the substrate comprises a piezoelectric material, in which the component is a component working with acoustic waves.

5. The component of claim 4,
   wherein the heat-conducting means comprise an electrically conductive layer applied on the back side, which is structured in two separate areas, which are arranged above different component structures, so that a capacitive coupling of the different component structures through the layer of the heat conducting means is avoided.

6. The component of claim 1, wherein the heat-conducting means comprises a layer applied across the entire surface area on the back side.

7. The component of claim 6, wherein the layer applied as a heat-conducting means on the back side extends down to at least one side surface of the substrate towards the carrier and is connected there to a heat sink.

8. The component of claim 3, wherein the metallic connecting means are formed as bumps or solder pads, which connect contact surfaces on the substrate with corresponding connection points on the upper side of the carrier.

9. The component of claim 7, wherein the heat-conducting means comprises a material selected from Al, Ag, Cu, Au, AlN and SiC.

* * * * *